United States Patent [19]
Ovshinsky et al.

[11] Patent Number: 5,296,716
[45] Date of Patent: * Mar. 22, 1994

[54] ELECTRICALLY ERASABLE, DIRECTLY OVERWRITABLE, MULTIBIT SINGLE CELL MEMORY ELEMENTS AND ARRAYS FABRICATED THEREFROM

[75] Inventors: Stanford R. Ovshinsky, Bloomfield Hills; Wolodymyr Czubatyj, Warren; Quiyi Ye, Rochester; David A. Strand, West Bloomfield; Stephen J. Hudgens, Southfield, all of Mich.

[73] Assignee: Energy Conversion Devices, Inc., Troy, Mich.

[*] Notice: The portion of the term of this patent subsequent to Nov. 24, 2009 has been disclaimed.

[21] Appl. No.: 747,053

[22] Filed: Aug. 19, 1991

Related U.S. Application Data

[63] Continuation-in-part of Ser. No. 642,984, Jan. 18, 1991, Pat. No. 5,166,758.

[51] Int. Cl.$^5$ ............................................. H01L 45/00
[52] U.S. Cl. ............................................. 257/3; 257/4; 257/5
[58] Field of Search ................................ 257/2–4, 257/5

[56] References Cited

U.S. PATENT DOCUMENTS

| | | | |
|---|---|---|---|
| 3,271,591 | 9/1966 | Ovshinsky | 357/2 |
| 3,699,543 | 10/1972 | Neale | 357/2 |
| 3,918,032 | 11/1975 | Nicolaides | 357/2 |
| 4,177,475 | 12/1979 | Holmberg | 357/2 |
| 4,203,123 | 5/1980 | Shanks | 357/2 |
| 4,845,533 | 7/1989 | Pryor | 357/2 |
| 5,166,758 | 11/1992 | Ovshinsky et al. | 257/3 |

Primary Examiner—William D. Larkins

[57] ABSTRACT

A solid state, directly overwritable, electronic, nonvolatile, high density, low cost, low energy, high speed, readily manufacturable, multibit single cell memory based upon phenomenologically novel electrical switching characteristics provided by a unique class of semiconductor materials in unique configurations, which memory exhibits orders of magnitude higher switching speeds at remarkably reduced energy levels. The novel memory of the instant invention is characterized, inter alia, by numerous stable and truly nonvolatile detectable configurations of local atomic and-/or electronic order, which can be selectively and repeatably accessed by electrical input signals of varying pulse voltage and duration.

70 Claims, 6 Drawing Sheets

ELECTRICALLY ERASABLE, DIRECTLY OVERWRITABLE, MULTIBIT SINGLE CELL MEMORY ELEMENTS AND ARRAYS FABRICATED THEREFROM

RELATED APPLICATION INFORMATION

This application is a continuation-in-part of U.S. application Ser. No. 642,984, filed Jan. 18, 1991, U.S. Pat. No. 5,166,758.

FIELD OF THE INVENTION

The present invention relates generally to electrically erasable memories and more particularly to solid state, electrically operated, directly overwritable, low energy, fast switching, non-volatile, multibit, single-cell memory elements and large area, high density memory arrays fabricated therefrom.

BACKGROUND AND PRIOR ART

The general concept of utilizing electrically writable and erasable phase change materials (i.e., materials which can be electrically switched between generally amorphous and generally crystalline states) for electronic memory applications is well known in the art and as is disclosed, for example, in U.S. Pat. No. 3,271,591 to the original inventor Ovshinsky, et al issued Sept. 6, 1966 and in U.S. Pat. No. 3,530,441 of Ovshinsky, et al issued Sept. 22, 1970, both assigned to the same assignee as the present invention, both disclosures of which are incorporated herein by reference.

As disclosed in the aforementioned Ovshinsky patents, such phase change materials can be electrically switched between two different structural states of generally amorphous and generally crystalline local order or between different detectable states of local order across the entire spectrum between the completely amorphous and the completely crystalline states. That is, the switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The materials described can also be switched between only two structural states of generally amorphous and generally crystalline local order to accommodate the storage and retrieval of binary encoded information.

The aforementioned pioneering Ovshinsky electrically erasable phase change memories were useful for many applications at the time of the original introduction thereof and were utilized in a number of commercially significant applications. However, because further development of that early technology was not possible due to the lack of the necessary financial resources to carry the same forward, subsequent developments in other fields of solid state, electronic memories and in other types of memories in general, such as those utilizing magnetic and optical media, displaced that early electrically erasable phase change technology in the marketplace.

As a result of the aforementioned lack of ongoing financial support, there were, prior to the instant invention, several limitations in the application of the electrically erasable memory of the early Ovshinsky phase change materials which have prevented their widespread use as solid state electrical replacements for archival, mass storage and cache memory elements currently dominating the computer field.

For example, in a typical personal computer there are four tiers of memory. Archival information is stored in inexpensive, slow, high storage capacity, non-volatile devices such as magnetic tape and floppy disks. This information is transferred as it is needed to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down in the computations by the time required to fetch data from the DRAM. Transfer of information among the tiers of the memory hierarchy occupies some of the computer's power and this need for "overhead" reduces performance, and, of course, it results in additional complexity in the computer's architecture. The current use of the hierarchal structure, however, is dictated by the price and performance of available memory devices and the need to optimize computer performance while minimizing cost.

The aforementioned limitations which have heretofore prevented the widespread use of the prior art Ovshinsky-type electrical memory materials as a replacement for present computer memory applications, such as specifically and without limitation, tape, optical, hard disk drive, solid state disk flash, DRAM, SRAM, and socket flash memory media, have included: (1) the relatively slow (by present standards) electrical switching speed which characterized such prior art phase change materials, particularly when switched in the direction of greater local order, i.e., in the direction of increasing crystallization; (2) the relatively high energy which had to be applied to memory elements fabricated therefrom in order to initiate the detectable change in local order, and (3) high cost per megabyte of stored information, particularly in comparison to hard disk storage. More specifically, it was necessary to apply a relatively high amount of energy in order to obtain detectable changes in the chemical and/or electronic bonding configurations of the chalcogenide material from which the element was fabricated as said element is set between one state and the other.

For example, the switching times of such prior art phase change materials were typically in the range of a few milliseconds for the set time, the time in which the material was switched from the amorphous state to the crystalline state; and approximately a microsecond for the reset time, the time in which the material was switched from the crystalline state back to the amorphous state. The electrical energy required to switch such prior art materials was relatively high, typically measured to be in the range of about a microjoule. It should be noted that this amount of energy must be deliverable to each of the memory elements in the solid state matrix of rows and columns of memory cells. Such high energy levels translate into high current carrying requirements which each of the isolation/address devices associated with each of the discrete memory elements must be capable of rectifying and carrying. If one takes into consideration the aforementioned energy requirements necessary for the successful operation of such a prior art matrix array, the choices of rectifying elements to which an artisan skilled in the art would be limited to very large single crystal isolation devices, thereby making the use of micron scale lithography and hence a high packing density of memory elements impossible. The low bit densities of the prior art matrix arrays would therefore have a high cost per megabyte of stored information.

By effectively narrowing the distinction in price and performance between archival, non-volatile mass memory and fast, volatile system memory, the memory elements of the instant invention provide for the creation of novel, non-hierarchal "universal memory system". Essentially all of the memory in the system can be low cost, archival and fast. As compared to original Ovshinsky-type phase change electrical memories, the memory materials described herein provide over 6 orders of magnitude faster programming time (less than 10 nanoseconds) and uses extraordinarily low programming energy (less than 50 picojoules) with demonstrated long term stability and cyclability (in excess of 20 million cycles). Also, experimental results indicate that additional reductions in element size can increase switching speeds and cycle life.

The concept of utilizing the aforementioned Ovshinsky-type phase change materials in non-erasable or non-reversible, write-once electrically programmable memories is also disclosed by the prior art. This type of electrically programmable phase change memory is described, for example, in U.S. Pat. No. 4,499,557 of Holmberg, et al. issued Feb. 12, 1985 and U.S. Pat. No. 4,599,705 of Holmberg, et al. issued Jul. 8, 1986, both of which are assigned to the same assignee as the present invention and the disclosure of which are incorporated herein by reference. These Holmberg, et al. patents include tetrahedrally chemically bonded materials such as carbon, silicon and germanium and alloys thereof as phase change materials which are utilized in a non-reversible or non-resettable mode. Such materials are disclosed as having, for example, characteristics which require threshold setting voltages of up to 10 volts, currents up to 25 milliamps and setting times of up to 100 microseconds. Thus, the set power required is up to 250 milliwatts with corresponding set times of up to 100 microseconds.

Due to the lack of ongoing financial support for further development, the general class of chalcogenide memory materials were not optimized and accordingly failed to find widespread use in reversible or electrically erasable memory applications. In marked distinction thereto, other types of solid state electrical memories have been developed to provide substantially faster switching times and substantially lower set and reset energies. Because of the improvements in time and energy, said other types of solid state, electronic memories now enjoy some limited acceptance in the marketplace. These other forms of memories typically employ several solid state microelectronic circuit elements for each memory bit, as many as three or four transistors per bit, for example, in some memory applications. The primary memory elements in such solid state memories, such as DRAM, are typically floating gate field effect transistor devices which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated.

In contrast to DRAM and SRAM volatile memory devices and unlike other non-volatile EEPROM devices, such as floating gate structures, no field effect transistor devices are required in the electrical memory devices of the instant invention. In fact the electrically erasable, directly overwritable memory elements of the instant invention represent the simplest possible electrical memory device to fabricate, comprising only two electrical contacts to a monolithic body of thin film chalcogenide material and a semiconductor diode for isolation. As a result, very little chip "real estate" is required to store a bit of information, thereby providing for a configuration of inherently high density memory chips. Further, and as will be detailed hereinafter, additional increases in information density can be accomplished in the memory elements of the instant invention through the use of multibit storage in each discrete memory cell.

Solid state, electronic memories presently in use are relatively expensive to manufacture, the cost being typically about twice the cost per bit of storage capacity in relation to magnetic disk storage. On the other hand, those solid state, electronic memories provide certain advantages over magnetic disk memories in that solid state memories have no moving parts, require much less electrical energy to operate, are easy to transport and store and are more versatile in the adaptability thereof for use with portable computers and other portable electronic devices. As a matter of fact, hard drive manufacturers are forecasting rapid growth in the use of ever smaller hard drives and eventually solid state memory storage in the portable computer field. In addition, such solid state memories are usually true random access systems as opposed to disk types which require physical movement of the disk head to the proper data track for accessing the desired memory location.

However, in spite of such advantages of solid state electrically erasable memories, the substantially higher costs thereof have prevented them from enjoying a substantial share of the market now dominated by magnetic disk type memory systems. Although solid state memories based on chalcogenide memory materials have shown potential for being manufactured at reduced costs, the overall performance parameters available from such transistor-based ferroelectric systems as previously known in the prior art have been inadequate to gain widespread use as replacements for magnetic disk systems or other solid state memory systems of the type described above.

Simply stated, no solid state memory system developed prior to the system disclosed by the instant invention, regardless of the materials from which it was fabricated, has provided all the advantages of being low cost, easily manufacturable, electrically writable and directly erasable (overwritable) low input energies, gray scale (allowing multibit in a single cell), non-volatile, and very high packing density. Accordingly, it is clear that the memory system described in the paragraphs which follow hereinafter will find immediate widespread use as a universal replacement for virtually all types of computer memory currently in the marketplace. Further, due to the ability of the novel memories of the instant invention to be fabricated in all thin-film format, three-dimensional arrays are now possible for high speed, high density neural network and artifical intelligence applications. The applicability of this technology to neural networks and artificial intelligence demands a multi-layer, three-dimensional approach.

As is readily apparent from the discussion above, the quantitative changes in switching speed and energy requirements of the memories of the instant invention in comparison to the phase change memories of the prior art is demonstrative evidence that the memory materials of the instant invention define an entirely new class of memory materials. Moreover, the wide dynamic range coupled with the multibit storage capabilities find no analog in the field of optical memory materials.

SUMMARY OF THE INVENTION

There is disclosed herein a new solid state, directly overwritable, electronic, non-volatile, high density, low cost, readily manufacturable, multibit single cell memory utilizing a unique class of chalcogenide memory materials in unique configurations, which memory materials exhibit orders of magnitude higher switching speeds at remarkably reduced energy levels. The electrical performance characteristics of these new memory materials are so remarkable, that although the materials are chalcogenide in nature, they vary so dramatically from prior art phase change materials, that there can be little doubt but that these memory materials belong to a newly discovered class of chalcogenide memory materials, the behavior of which could not have been previously predicted. The novel memory of the instant invention is characterized, inter alia, by numerous stable and truly non-volatile detectable configurations of local atomic and/or electronic order, which can be selectively and repeatably established by electrical input signals of varying pulse voltage and duration. The memory of the instant invention is therefore switchable between more than two atomic and/or electronic configurations of detectably different local order so as to be immediately applicable to provide a wide dynamic range of gray scale memory settings. The orders of magnitude of improvement in switching speeds and in switching energies made possible by the memory elements disclosed herein is not merely incremental in nature, but rather represents a synergistic improvement beyond what was thought possible with prior art materials.

Another extremely important characteristic of the present class of chalcogenide memory materials is their ability to be set to low resistance values with electrical pulses of lower energy than the pulses required to set the materials at higher resistance values. This is in direct opposition to the way in which the prior art chalcogenide memory materials were known to behave. The prior art materials required higher energy pulses to set at low resistance values and lower energy pulses to set at high resistance values. Therefore any chalcogenide memory material which is capable of fast switching times, low switching energies, direct overwrite of stored information, gray scale dynamic range of resistances and requires lower energy pulses to set at low resistance values and higher energy pulses to set at higher resistance values is a member to this newly discovered family of Ovonic high-speed, low-energy, direct-overwrite, gray-scale chalcogenide memory materials.

In one preferred embodiment of the instant invention, an electrically switchable, directly overwritable, multibit, single-cell memory element is described which includes a volume of memory material defining a single cell memory. The memory material is characterized by a large dynamic range of electrical resistance values and the ability to be set at one of a plurality of resistance values within said dynamic range in response to a selected electrical input signal so as to provide said single cell with multibit storage capabilities. A pair of spacedly disposed contacts are provided for supplying said electrical input signal to set said memory material to a selected resistance value within the dynamic range and the single cell of memory material is setable, by said selected electrical signal to any resistance value in said dynamic range, regardless of the previous resistance value of said material.

While theories are presently being intensively investigated no theory has been proposed to date which explains all of the extraordinary electrical switching behavior observed for the memory material of the instant invention. Specifically, the subject memory material can be switched between numerous electrically detectable conditions in nanosecond time periods with the input of picojoules of energy. The subject memory material is truly non-volatile and can be written almost indefinitely while maintaining the integrity of the information stored by the memory cell without the need for periodic refresh signals. The subject memory material is directly overwritable so that information stored in other memory elements need not be erased (as is required with ferroelectric storage systems) in order to change information stored in a given set of memory elements. Finally, the large dynamic range offered by the memory material of the subject invention provides for the gray scale storage of multibits of binary information in a single memory cell.

Further, memory configurations utilizing the novel materials of the instant invention are set forth in which the bit density of the memory element has been greatly increased and enhanced over prior art configurations and in which performance parameters are further improved.

Other embodiments and features of the present invention as well as other advantages and objects thereof will be set forth and become apparent from the detailed description which follows hereinafter, especially when taken in combination with the accompanying drawings.

DETAILED DESCRIPTION OF THE INVENTION

Figure 1:
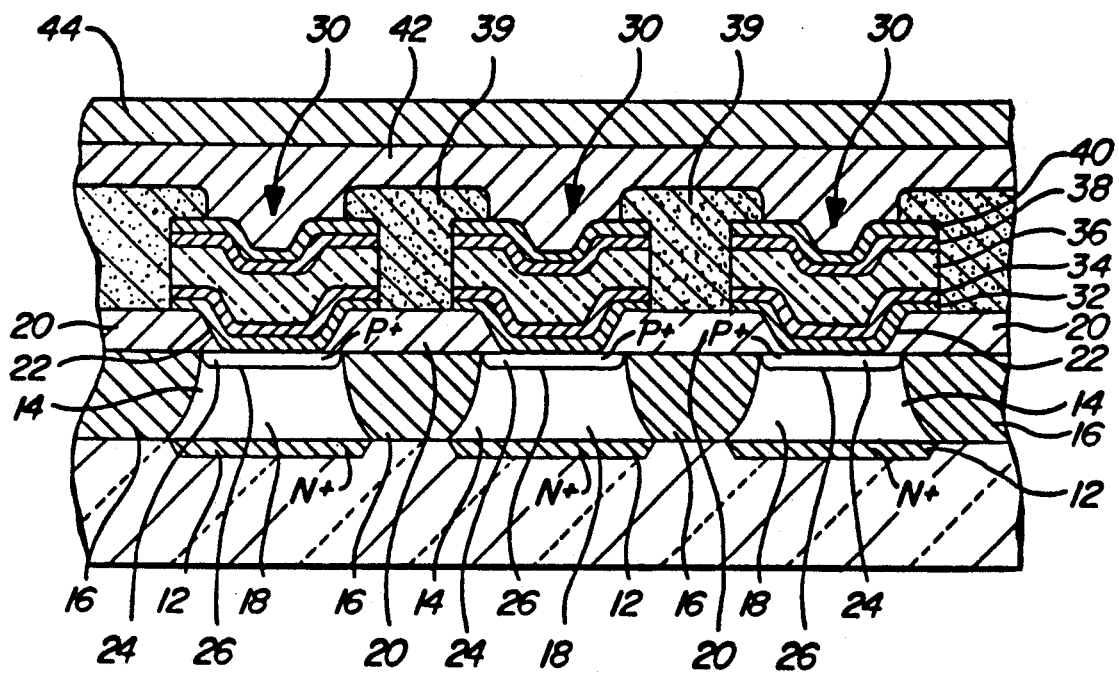
FIG. 1 is a fragmentary cross sectional view illustrating a portion of an integrated circuit electrically erasable and directly overwritable multibit memory configuration of a first preferred embodiment of the present invention.

Erasable electrical memories fabricated from the broad class of chalcogenide materials have previously been based on changes in structural structure, which changes were accommodated by atomic movement of certain species within the material to permit phase separation as the material is switched from the amorphous state to a multi-phase crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. A typical composition of such a prior art material would be, for example, $Te_{81}Ge_{15}S_2As_2$. Another example of such a prior art material is $Te_{81}Ge_{15}S_2Sb_2$. Because Te is so highly conductive in its crystalline state, a very low resistance condition was therefore established through the crystalline Te filament which was a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the material was switched back to the amorphous state, the Te which had precipitated out into the crystalline filament was required to migrate within the material from its locally concentrated form in the filament back to its atomic configuration in the amorphous state.

This atomic migration, diffusion or rearrangement between the amorphous and crystalline states required in each case a holding or dwell time necessary to accommodate the migration, thereby making the switching time and energy relatively high compared to other types of erasable semiconductor memories.

We have now discovered certain new principles which permit a remarkable improvement in both switching time and energy for an improved and fundamentally different type of electrically erasable, directly overwritable memory primarily based on chalcogenide semiconductor materials.

Although specific examples of memory material are described hereinafter, the memory element of the present invention can be fabricated from any body of memory material which meets the requirements set forth above for the newly discovered family of high-speed, low-energy, direct-overwrite, gray-scale memory material. Preferably the body of memory material is monolithic, homogenous and formed of a chalcogenide material selected from the group of Te, Se, Ge, Sb and mixtures or alloys thereof. Additional materials useful in the memory devices of the instant invention are disclosed in U.S. application Ser. No. 657,170, filed Feb. 15, 1991 assigned to the assignee of the instant invention and hereby incorporated by reference.

Again, as stated above, no theory has been proposed to date which explains all of the extraordinary electrical switching behavior observed for the memory material of the instant invention. Specifically, the subject memory material can be switched between numerous electrically detectable conditions of varying resistivity in nanosecond time periods with the input of picojoules of energy. The subject memory material is truly non-volatile and will maintain the integrity of the information stored by the memory cell (within a selected margin of error) without the need for periodic refresh signals. The subject memory material is directly overwritable so that the memory elements not be erased (set to a specified starting point) in order to change information stored within the elements. Finally, the large dynamic range offered by the memory material of the subject invention provides for the gray scale storage of multibits of binary information in a single cell by mimicking the binary encoded information in analog form and thereby storing multiple bits of binary encoded information as a single resistance value in a single cell. As used herein, the term "non-volatile" will refer to the electrical memory of the instant invention in which the set resistance value can be held constant for archival time periods without losing the integrity of information stored therein. Of course, software (including the feedback loop discussed hereinafter) can be employed in conjunction with the memory elements to insure that no "drift" occurs outside of the selected margin of error which would impede gray scale storage of information and/or cause loss of stored information.

Of course, chalcogenide semiconductor materials are characterized by a forbidden energy zone or band gap separating the conduction and valence bands thereof (see the "Cohen, Fritsche, Ovshindky model describing the mobility gap of chalcogenide semiconductor materials). It has been experimentally demonstrated that activation energy, i.e., the amount of energy required to move a charge carrier from the Fermi level to the respective edge of the band gap, can be varied over a very wide dynamic range, thereby providing for multibit storage in each memory element. However, theories heretofore hypothesized can neither explain the very low energy requirements needed to set the memory elements at a given resistance value nor can those theories explain the types of results presented graphically hereinafter. Regardless of the explanation of the manner in which this is accomplished, there is presented herein a completely novel memory material providing a combination of valuable electrical switching characteristics never before available in a single memory element.

In our previous and copending application, we discussed the composition, $Te_{51}Ge_{40}Sb_9$, which was said to form a single crystalline phase of substantially the same composition as the elements in the amorphous state. Thus, the material was described as compositionally substantially the same in the amorphous state and in the single crystalline phase formed when the material is electrically switched. This material was said to have its electronic band gap collapse in the transition from the amorphous state and the crystalline state such that it is no longer a semiconductor but rather is a metal or a semi-metal. That is, its band gap was thought to collapse and the conduction and valence bands to overlap in the crystalline state, thereby providing a very high electrical conductivity which exhibits essentially a metallic form of electrical conduction. However, while the experimental results were accurate, the theory was not. This theory was proved incomplete by an analysis done by microscopy which demonstrated the material could not be a semi-metal due to the material's transmission properties.

If one views a large volume of memory material, it is possible that the erasably switchable alloys are selected such that substantially all of the elements in the composition are distributed in the amorphous state and are all substantially absorbed per unit volume of the material into stable crystalline phases in the transition from the low resistance state to various degrees of greater conductivity. The result is a material which can be very rapidly switched between two states of differing degrees of local order at a very low energy, that is, at switching times and energy levels far below those attainable or heretofore even considered possible with prior art erasable electrical memory materials.

It remains possible that the compositional stoichiometry of the constituent elements within the material is such that all of the constituent elements are substantially fully absorbed per unit volume in one or more crystalline phases which are formed in the high conductivity state. In addition, the constituent elements may be preferably absorbed in the one or more crystalline phases with substantially the same average local atomic density distribution, i.e., the same average local concentration, of the constituent elements as present in the high resistance state. Thus, the material may be fully crystallized per unit volume and the local atomic density of the constituent elements may be only minimally disturbed by the transitions between the differing ranges of amorphicity and crystallinity. Atomic migration within the material during phase transitions may thus be minimized and electrical switching speeds and energies might be remarkably reduced by orders of magnitude below prior art electrically erasable phase change memories.

It is further speculated that the elements of the material will usually be substantially homogeneously distributed within the material as originally deposited but may become locally somewhat concentrated in certain regions of the material to conform to the crystalline phase locations and concentrations of the atoms in the matrix. However, in the phase transition from the high conductivity to the high resistance state, the material becomes molten and diffusion takes place which would tend to distribute the atoms somewhat homogeneously within the bulk of the material. Such homogenous distribution in the high resistance state is not necessary, however, for the material to function in accordance with the invention. The elements of the memory material are thus described herein as being distributed throughout the material in the high conductivity state, but it is to be understood that such distribution may include some localized concentrations of some or all of the elements that may occur with switching back and forth between states of varying conductivity.

The term "amorphous" as used herein refers to a condition which is relatively structurally less ordered or more disordered than single crystal and has a result thereof at least one detectably different electrical characteristic, such as a lower electrical conductivity. The term "crystalline" as used herein refers to a condition which is relatively structurally more ordered than amorphous and has as a result thereof at least one detectably different electrical characteristic, such as a higher electrical conductivity.

It is further believed that the relatively small crystallite size (on the order of 50 to 500 Å) which exists in the bulk of the memory material, said crystallites believed to be surrounded by an amorphous skin may contribute to the rapid formation of the many phases of the dynamic range, detectable as different resistances, as well as to the lower energy requirements for the transitions between those detectable resistance values to which the material can be reliably and repeatably set.

In accordance with still another aspect of the present invention, it has been found that the switching characteristics of the subject electrically erasable directly overwritable memory materials may be controlled such that repeatable and detectable switching resistance values can be effected. It has been found that, in order for the memory materials of the present invention to perform at the substantially enhanced speed and energy levels as compared to the performance parameters of the prior art, exact compositional stoichiometry is not required since the crystallographic lattice typically tolerates a certain degree of inhomogeneity without effecting substantial degradation in the performance thereof. The word "substantially" is therefore used herein to mean that level of conformance to the stoichiometric principles taught herein which enable the attainment of the improvements in electrical switching performance parameters as compared to prior art electrically erasable memories provided by the present invention.

As noted above, it is also believed that the relatively small crystallite size may contribute to the rapid transition between those detectable resistance values. It has now been postulated that a microcrystalline lattice structure switches more rapidly between those resistance values because the microstructures can be readily adjusted to on the atomic and/or electronic level.

One characteristic of the semiconductor materials of the present invention is that the tendency thereof toward the formation of more and smaller crystallites per unit volume of the material. Crystallite sizes of representative materials embodying the present invention have been found to range from about 50 to 500 Å, and generally less than the range of 1,000 to 5,000 Å which was characteristic of prior art materials. Crystallite size is defined herein as the diameter of the crystallites, or the "characteristic dimension" thereof, equivalent to the diameter where the crystallites are not spherically shaped.

It has been determined that the composition in the highly resistive state of the class of TeGeSb materials which meet the criteria of the present invention are generally characterized by substantially reduced concentrations in Te relative to that prevent in prior art materials used as electrically erasable memory materials. In the compositions in this class which have been found to provide the substantially improved electrical switching performance characteristics, the average concentrations of Te in the amorphous state were well below 70%, typically below about 60% and ranged in general from as low as about 23% up to about 56% Te and most preferably about 48% to 56% Te. Concentrations of Ge were above about 15% and ranged from a low of about 17% to about 44% average in the high resistance state, remaining generally below 50% Ge, with the remainder of the principal constituent elements in this class being Sb. The percentages given are atomic percentages which total 100% of the atoms of the constituent elements. Thus, this class of materials may be characterized as $Te_aGe_bSb_{100-(a+b)}$, where a is equal to or less than about 70% and preferably between about 60% to about 40%, b is above about 15% and less than 50%, preferably between about 17% to about 44% and the remainder is Sb.

In the case of the TeGeSb class of materials, the following crystalline phases were found to be present either singly or in combination in various forms of the low resistance state for various approximate compositions falling within the above ranges:

TABLE I

| Observed Crystalline Phases of TeGeSb | | | |
| --- | --- | --- | --- |
| Name of Phase | At % Te | At % Ge | At % Sb |
| α | 51 | 44 | 5 |
| β | 51 | 40 | 9 |
| γ | 45 | 28 | 27 |
| δ | 23 | 19 | 58 |
| η | 56 | 17 | 27 |
| κ | 53 | 30 | 17 |

The average for these elements in the high resistance, more disordered state was in one sample about 53% Te, 21% Ge and 26% Sb.

While the invention is set forth hereinafter with crystalline semiconductor diode devices as the preferred isolation means, any other device which is capable of electrically isolating each memory element from the remainder of the elements at the required voltages and which has a small footprint is equally useable in place of the crystalline diodes. Other such isolation devices are thin film polycrystalline semiconductor diodes, single crystal semiconductor diodes, Ovonic threshold switches and single crystal or thin film transistors.

Referring now to FIG. 1, there is shown a cross sectional view of a portion of the structure of an electrically erasable memory of the present invention. The memory structure is formed on a single crystal silicon semiconductor wafer 10 which is p-doped and which forms a p-substrate for the deposition of the remaining elements of the configuration illustrated.

Formed in the p-substrate 10 are n+ channels 12, which may be formed by diffusion in a manner well known in the art. These n+ channels extend across the chip in a direction perpendicular to the plane of the illustration and form one set of electrodes, in this case the y set, of an x-y electrode grid for addressing the individual memory elements.

On top of this n+ grid structure is formed an n-doped crystalline epitaxial layer 14, again by techniques well known in the art. The n doped epitaxial layer 14 may be about 5,000 Å thick, for example. Using known masking and doping techniques, p-doped isolation channels 16 are then formed in the n-epitaxial layer 14. These p-doped isolation channels 16 extend all the way down to the p substrate 10 as shown in FIG. 1 and also extend completely around and isolate and define islands 18 of the n-epitaxial layer 14. The islands 18 are shown more clearly in the top view of FIG. 2 wherein the p isolation channels are shown as forming an isolation grid defining and isolating the islands 18 of n epitaxial material. Instead of the p-doped isolation channels, $SiO_2$ isolation trenches may be used for isolation of the islands 18. The technique of formation of such $SiO_2$ isolation trenches is well known to those skilled in the art.

A layer 20 of thermally grown $SiO_2$ is then formed on the structure just described and etched out to form apertures 22 over the islands 18. Diffusion regions 24 of p+ material are then formed within the areas defined by the apertures 22 as shown in FIG. 1. The semiconductor junctions of the p+ regions and the n epitaxial layer form p-n junction diodes 26 in series with each of the regions of the n epitaxial layer exposed through the apertures 22 of the $SiO_2$ layer 20.

The memory elements 30 are then deposited over the p+ regions 24 in individual ohmic electrical series contact with the diodes 26. The memory elements 30 are comprised of bottom thin electrical contact layers of molybdenum 32 and carbon 34, the memory layer 36 formed of a material as described above, and upper thin electrical contact layers 38 of carbon and 40 of molybdenum. The contact layers 32, 34, 38 and 40 of carbon and molybdenum form excellent electrical contacts with the memory layers 36 and also form diffusion barriers which effectively block diffusion of elements into and out of the memory layers 36.

The carbon layers 34 and 38 have a relatively high electrical resistivity and are more difficult to etch and are therefore preferably relatively thin, typically in the range of 100 to 1,000 Å or so. The molybdenum layers 32 and 40 should be thicker, say in the range of 1,000 to 2,000 Å or so in order to act as effective diffusion barriers for the memory layers 36.

The memory layer 36 is formed of a multi-element semiconductor material, such as the chalcogenide materials disclosed herein. The layer 36 is preferably sputter deposited in the high resistance state, but may be formed in other ways such as by evaporation or by chemical vapor deposition, which may be enhanced by plasma techniques such as RF glow discharge. The memory layer 36 may typically range in thickness from about 200 Å to about 5,000 Å, preferably about 400 to 2,500 Å and most preferably about 750 to 1,250 Å in thickness. The lateral dimension or diameter of the pore of semiconductor material 36 may be in the range of less than about one to two micrometers or so, although there is no practical limit on the lateral dimension. It has been determined that the diameter of the actual filamentary conductive path of the high conductivity material is less than one-third of a micrometer. The pore diameter can thus be as small as lithography resolution limits will permit.

In a preferred embodiment of the present invention, the pore diameter is selected such that it conforms substantially with the diameter of the low resistance path which is formed when the material is switched to the low resistance state. The diameter of the pore of memory material 36 is therefore preferably less than about one micrometer so that the volume of the memory material 36 is limited as much as is feasible to the volume of the material 36 which is actually switched back and forth between the high and low resistance states. This further reduces the switching time and the electrical energy required to initiate the detectable change in resistance. The pore diameter as used herein means the cross sectional lateral dimension of the layer of memory material 36 which extends under the contact regions formed with that memory layer 36 and with the lower p+ layer and the upper conductors 42 as shown in the embodiment of FIG. 1 and, in the case of the embodiment of FIG. 2, with the lower metal layer 29 of the Schottky diode.

It is further preferred that the pore regions of the memory elements 30 be thermally isolated and/or controlled except only for the required electrical contacts with the upper and lower contacts as necessary for proper operation of the memory elements. This further confines, limits and controls the heat transfer from the switched volume of the pore the electrical energy required for the resistance transitions. This is accomplished in the embodiments of FIGS. 1 and 2 by the oxide layers 20 and 39 which surround the lateral peripheral portions of the memory elements 30.

The layers 32, 34, 36, 38 and 40 are etched and an oxide layer 39 is formed thereover and etched to leave openings above the memory elements 30 as shown. Alternatively, the memory elements may be formed in a two step etch process with layers 32 and 34 being first deposited and etched and then remaining layers 36, 38 and 40 being deposited thereover and separately etched to the selected dimension. Deposited on top of the entire structure just described is the second electrode grid structure formed of aluminum conductors 42, which extend perpendicular in direction to the conductors 12 and complete the x-y grid connection to the individual memory elements. Overlaying the complete integrated structure is a top encapsulating layer 44 of a suitable encapsulant such as $Si_3N_4$ or a plastic material such as polyimide, which seals the structure against moisture and other external elements which could cause deterioration and degradation of performance, particularly of the phase change materials in the memory layer 36. The $Si_3N_4$ encapsulant can be deposited, for example, using a low temperature plasma deposition process. The polyimide material can be spin deposited and baked after deposition in accordance with known techniques to form the encapsulant layer 44.

Figure 2:
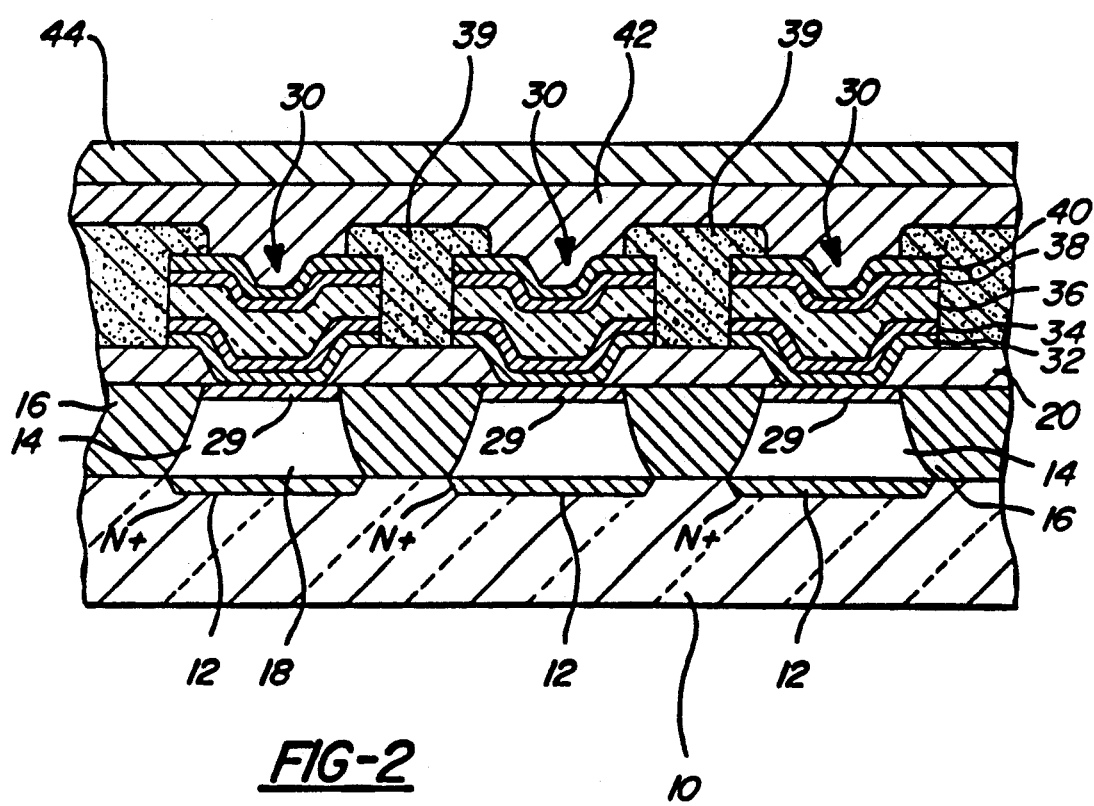
FIG. 2 is a fragmentary cross sectional view illustrating a portion of an integrated circuit electrically erasable and directly overwritable multibit memory configuration of a second preferred embodiment of the present invention.

The embodiment of FIG. 2 is the same as FIG. 1 except that a diode 27 is formed of a Schottky barrier between the n layer 14 and a metal layer 29 which may be, for example, platinum silicide. In other respects, the embodiment of FIG. 2 is formed in the same manner as that of FIG. 1 and like elements are labeled with like numerals.

Figure 3:
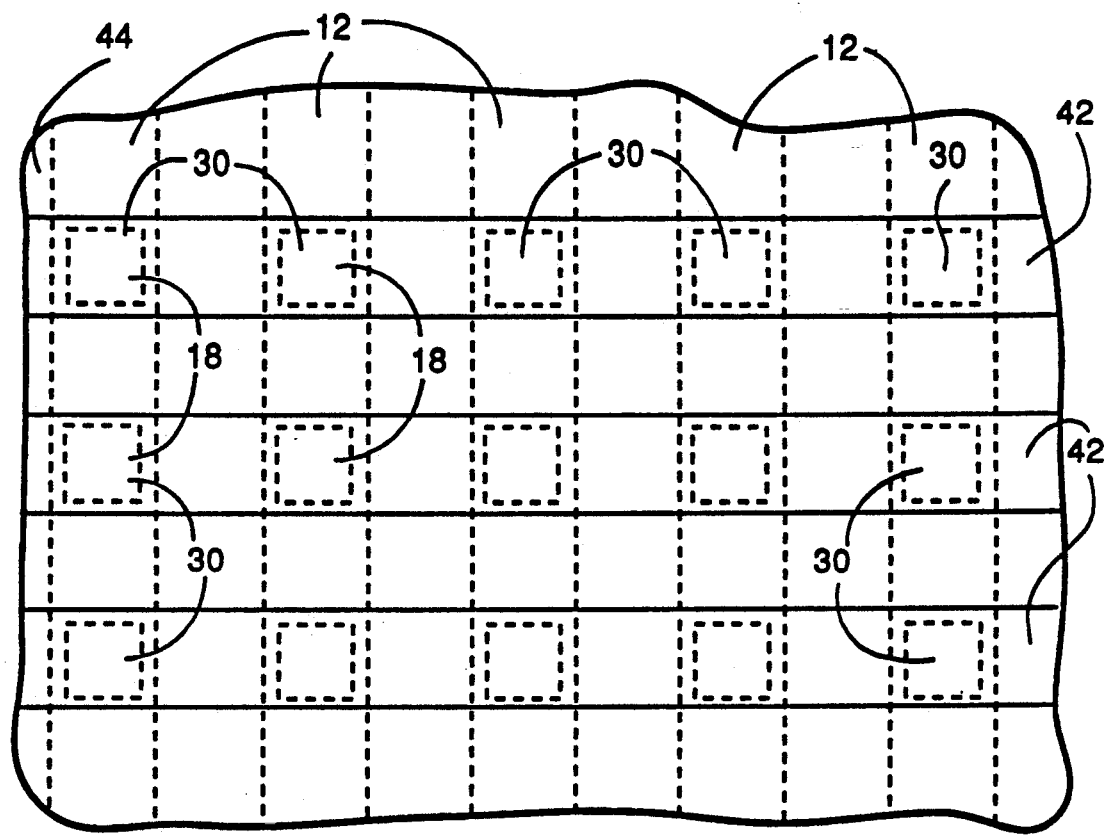
FIG. 3 is a top plan view illustrating a portion of the integrated circuit configurations of FIGS. 1 and 2.

The integrated structure thus formed is an x-y memory matrix connected as shown in FIG. 3 in which each memory element 30 is connected in series with a diode 26 between a horizontal x-line 42 and a vertical y-line 12. The diodes 26 serve to electrically isolate each of the memory elements 30. Other circuit configurations for the electrically erasable memory of the present invention are, of course, possible and feasible to implement. One particularly useful configuration is a three dimensional, multilevel array in which a plurality of planes of memory elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. Conventional CMOS technology cannot be used to produce this type of three dimensional memory array since CMOS technology builds the required semiconductor devices into the bulk of single crystal semiconductor wafers and, therefore, can only be used to fabricate a single layer of devices. Furthermore, (1) CMOS cannot produce a small enough footprint (actual element dimension) to cost effectively produce large arrays and (2) CMOS devices, because they exist in a single plane, cannot be interconnected along the Z direction. Therefore, CMOS devices cannot be fabricated with the complex, three-dimensional interconnectivity required for advanced parallel processing computers. The three-dimensional, thin-film memory array structures of the instant invention, on the other hand are capable of both conventional serial information processing as well as parallel information processing. Parallel processing and therefore multidimensional memory array structures are required for rapid performance of complex tasks such as pattern recognition, classification or associative learning etc. Further uses for and description of parallel processing is given in U.S. patent application Ser. No. 594,387, filed Oct. 5, 1990, which is assigned to the assignee of the instant application and the disclosure of which is hereby incorporated by reference.

With the integrated structure as shown in the embodiment of FIGS. 1 and 2, however, a completely vertically integrated structure of the memory element and its isolating diode is formed, thus minimizing the area occupied on the substrate by each of the combinations of memory elements and diodes. This means that the density of the memory elements in the chip is limited essentially only by the resolution of the lithography.

Figure 5:
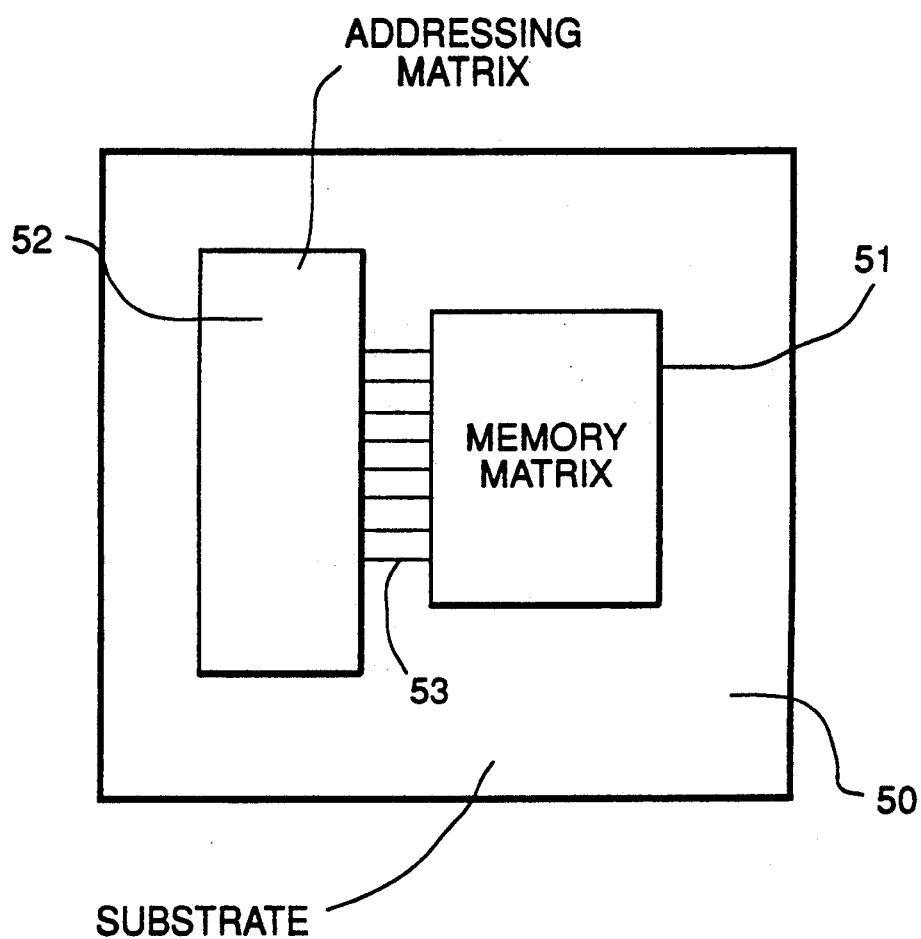
FIG. 5 is a diagrammatical illustration illustrating a portion of a single crystal semiconductor substrate with the integrated memory and addressing matrixes depicted in FIGS. 1 and 2 of the present invention.

In FIG. 5, there is diagrammatically illustrated a portion of a single crystal semiconductor substrate 50 with a memory matrix 51 of the present invention formed thereon. Also formed on the same substrate 50 is an addressing matrix 52 which is suitable connected through integrated connections 53 to the memory matrix 51. The addressing matrix 52 includes signal generating means which define and control the setting and read pulses applied to the memory matrix 51. The addressing matrix 52 may be integrated with and formed simultaneously with the memory matrix 51.

In prior art semiconductor memories having the high switching speeds and low switching energies deemed necessary for most applications of such memories, at least one transistor is required along with a capacitor for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these are made in vertical relationship to each other. Further, each memory element, complete with isolating diode and the pair of contacts for the element, is itself fully vertically integrated such that a much higher bit density is attained over that possible with prior art integrated circuits performing the same or similar functions.

In fact, the memory of the present invention provides for a bit density which is greater than that attainable even in solid state dynamic random access memories (DRAM's), which are volatile and therefore lack the further advantages that non-volatility attainable with the present invention provides. The increase in bit density attainable with the present invention is translated into a corresponding reduction in manufacturing costs because of the smaller areas of the wafer occupied per bit of the integrated circuit configuration. This allows the memory of the present invention to compete with and surpass other available memories for a wider range of applications, not only in terms of electrical performance and memory storage capacity but also in terms of cost.

By comparison with prior art semiconductor memories formed of at least one transistor and a capacitor for each bit, the integrated circuit configurations of the present invention as shown in FIGS. 1 and 2 can be formed on a chip with greater bit density compared to prior art configurations for the same lithography resolution. In addition to the cost advantages which the higher bit density affords, the performance parameters of the memory in the integrated circuit configuration of the present invention are thus even further improved in that the elements are positioned closer together and lead lengths, capacitances and other related parameters are further minimized, thereby enhancing performance.

Figure 4:
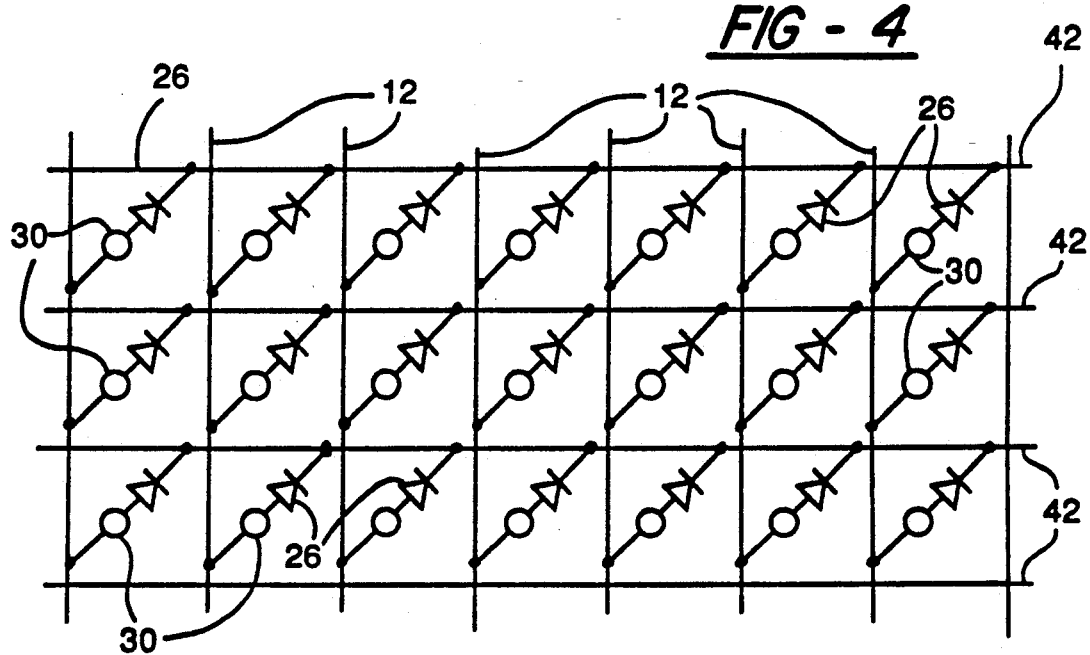
FIG. 4 is a schematic circuit diagram illustrating a portion of the circuitry of the integrated circuit configurations of FIGS. 1 and 2.

FIG. 4 is a circuit diagram of a portion of the embodiments of FIGS. 1-3. The circuit comprises an x-y grid with each of the memory elements 30 being connected in series with a diode 26 at the cross points of the x address lines 42 and the y address lines 12 as shown. The address lines 12 and 42 are connected to external addressing circuitry in a manner well known to those skilled in the art.

Of course, it is to be appreciated that we have discovered that the reduction in energy requirements correspond, inter alia, to a reduced thickness of the memory material. Further reductions in said thickness would further reduce the pulse energy required to set a memory element to a given resistance value. However, said thickness requirement must be balanced taking into consideration the realities of modern wafer fabrication processing.

Figure 6:
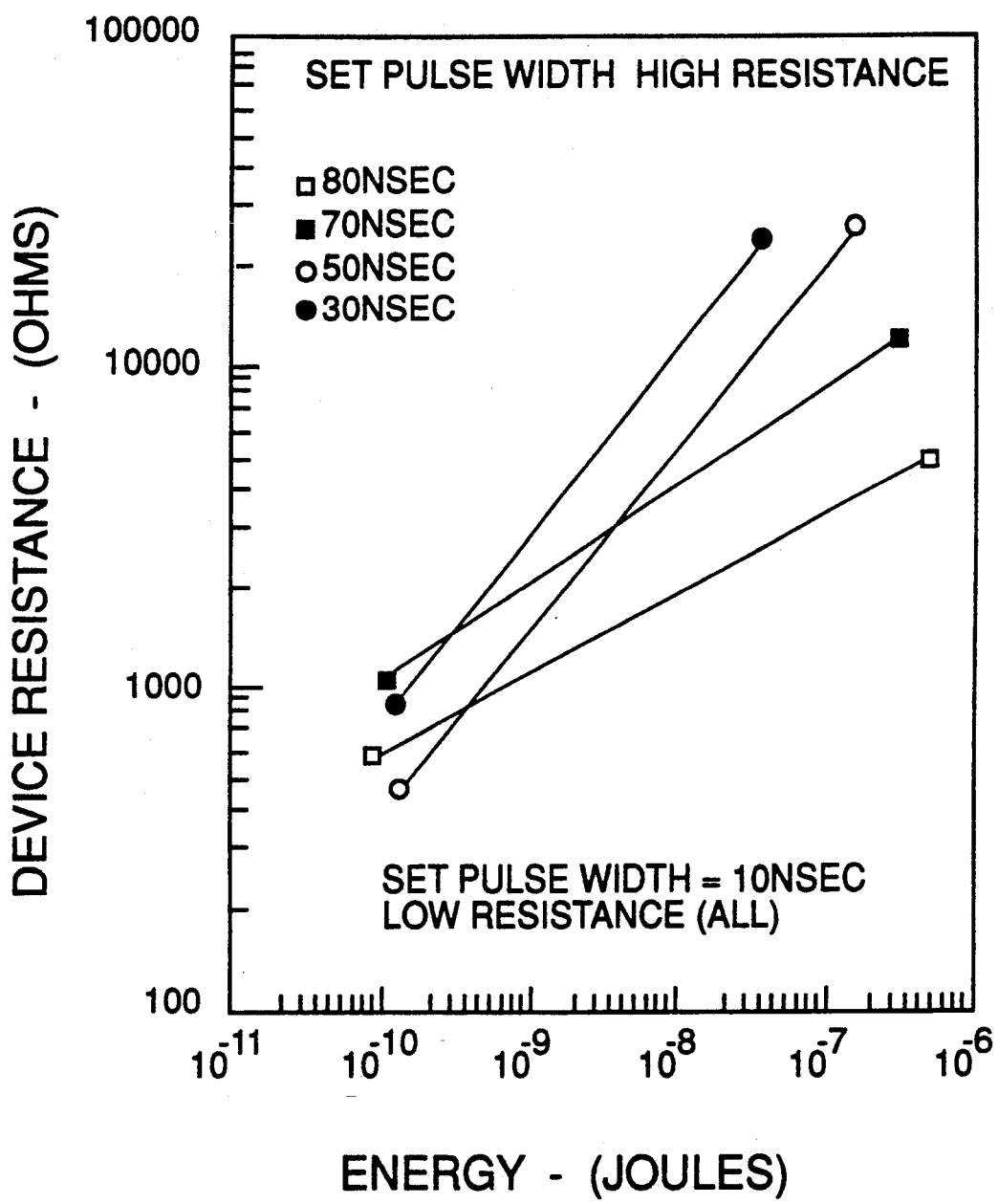
FIG. 6 is a graphical presentation of data taken on sample devices showing resistance in relation to switching energy for different pulse widths.

FIG. 6 is a graphical presentation of data on electrical switching characteristics taken on samples of memory elements of the present invention. Device resistance in ohms is shown in relation to switching energy in Joules for pulse widths ranging from 30 to 80 nanoseconds. The ratio of resistances in a first high resistance state to a second low resistance state are all separated by almost a full order of magnitude or more and are thus fully adequate to assure error free electrical detection between the high and low resistance conditions for digital memory applications.

Figure 7:
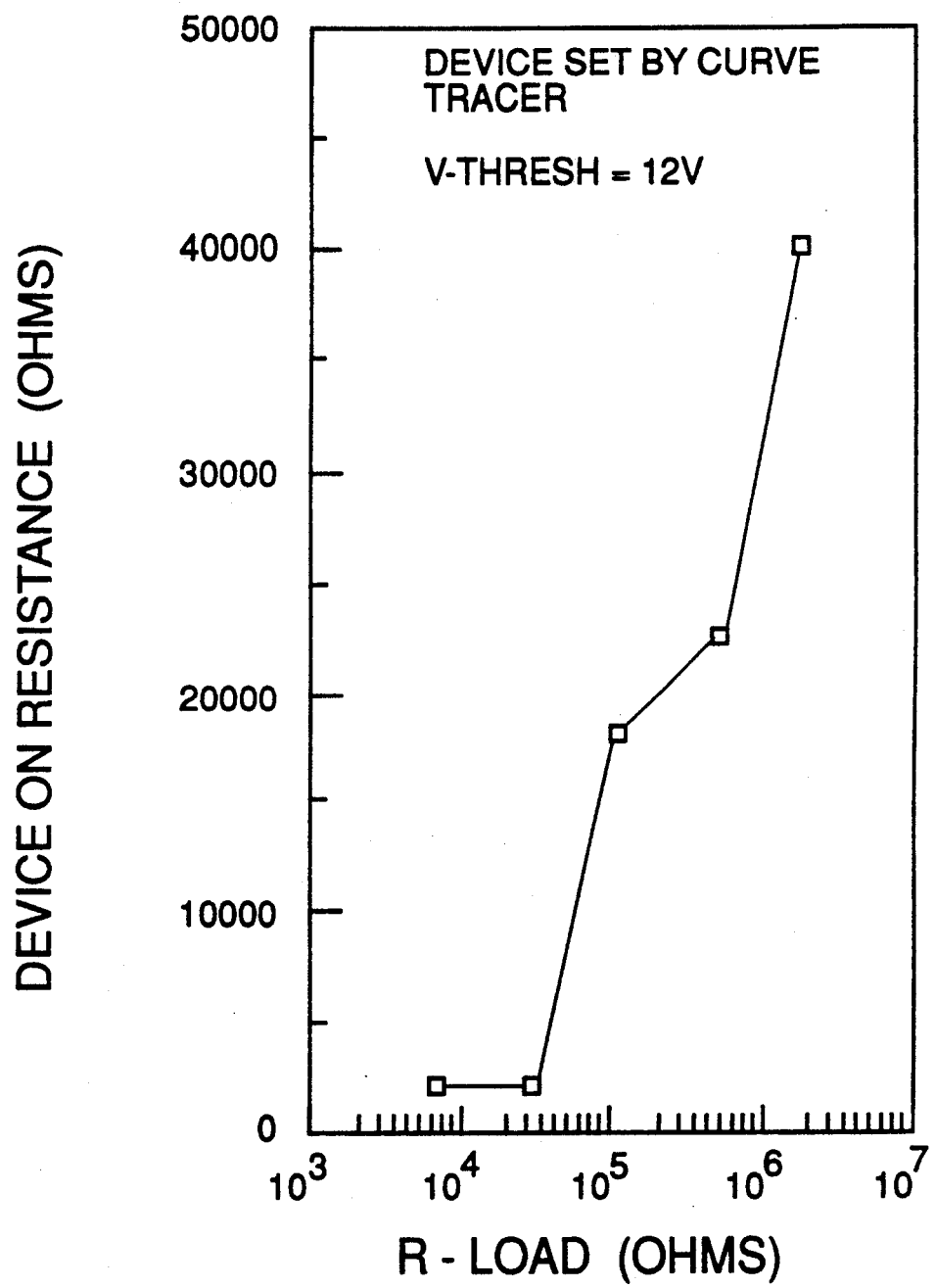
FIG. 7 is a graphical presentation of data relating to device resistance as a function of load resistance which controls current flow after the first firing of the device.

FIG. 7 shows data taken on the device "on" resistance in ohms in relation to load resistance in ohms. The load resistance is connected in series with the device and hence serves to determine the magnitude of the current flow upon firing. The data was taken using a threshold voltage of 12 volts. The "on" resistance of the device decreases rapidly as a function of increasing set current down to a level of 100 ohms or so.

Figure 8:
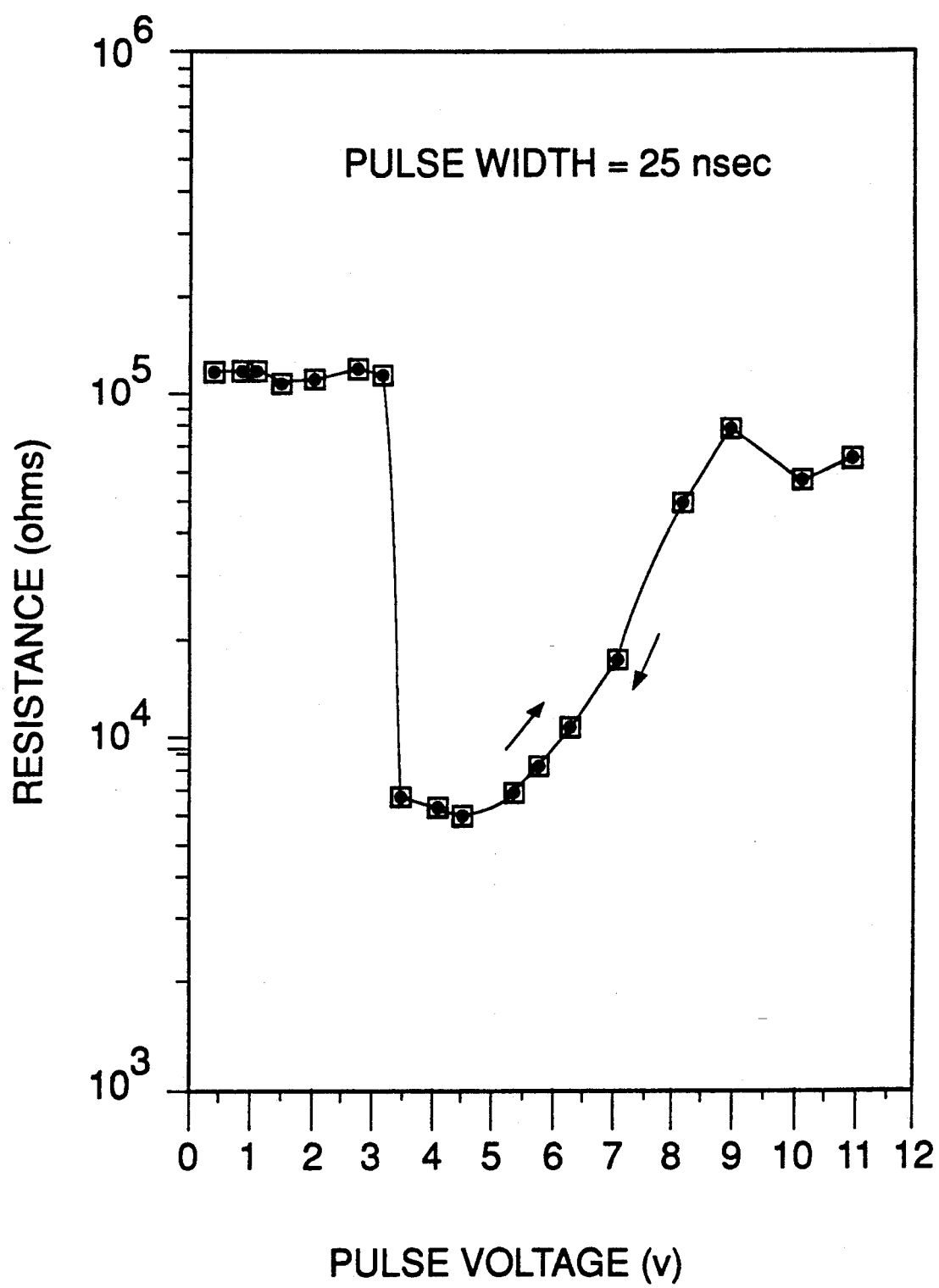
FIG. 8 is a graphical representation of data relating to device resistance as a function of signal pulse voltage illustrating the multibit storage capabilities of single cell devices of the instant invention.

FIG. 8 is a graphical representation of data taken on device resistance in relation to applied pulse voltages for pulse durations of 25 nanoseconds. Perusal of this figure clearly indicates the wide dynamic range of resistance values attainable with the memory elements of the present invention. This range of resistances is greater than about one order of magnitude. The data in FIG. 8 shows a device resistance of about $6 \times 10^3$ ohms for an input electrical signal of 3 volts, corresponding to the low resistance end of the dynamic range, and a device resistance of about $7 \times 10^4$ ohms for an input electrical signal of 9 volts, corresponding to the high resistance end of the dynamic range. The linearity of this resistance versus voltage plot as well as the ability to proceed in both directions along said line is to be noted. It is this wide dynamic range, the linearity of the plot and the ability to move in both directions therealong which provides the memory with multibit storage capabilities.

Through experimentation the instant inventors have shown that factors such as pore dimensions (diameter, thickness, and volume), chalcogenide composition, signal pulse duration and signal pulse waveform shape have an effect on the magnitude of the dynamic range of resistances, the absolute endpoint resistances of said dynamic range and the voltages required to set the device at these resistances. For example, relatively thick chalcogenide films (i.e. about 4000 Å) will result in higher set voltage requirements (i.e. 15-25 volts), while relatively thin chalcogenide layers (i.e. about 500 Å) will result in lower set voltage requirements (i.e. 1-7 volts).

The signal pulse duration required to set the memory element to the desired resistance within the dynamic range of resistances depends upon factors such as signal voltage and chalcogenide composition. Typically signal pulse durations will be less than about 250 nanoseconds and preferably less than about 50 nanoseconds.

A feedback loop which reads and, when required, adjusts the resistance of a given memory element may be incorporated into the memory systems of the instant invention. For example, a memory element may initially be set at a desired resistance, however in time the resistance of the element may drift slightly from the value at which it was originally set. The feedback loop, in this instance, would the calculate and deliver a signal pulse of the required voltage and duration to the memory element to bring it back to a preselected resistance value. Also, circumstances may exist wherein the set pulse delivered to a memory element may not result in setting of the element at the desired resistance value. In this case the feedback loop would deliver additional signal pulses to the element until the desired resistance level is achieved. The total duration of this series of set/adjust cycles is preferably less than about 500 nanoseconds.

As indicated by the arrows in FIG. 8, a signal pulse of a selected voltage will set the memory element to the resultant resistance, regardless of previous set condition. This ability provides for direct overwrite of previously stored data. This direct overwrite capability is not possible with the phase change materials of the prior art.

The dynamic range of resistances also allows for broad gray scale analog memory storage. This is accomplished by dividing the broad range into a plurality of sub-ranges or levels. This analog storage ability allows for multiple bits of binary information to be stored in a single memory cell. This multibit storage is accomplished by mimicking multiple bits of binary information in analog form and storing this analog information in a single memory cell. Therefore, by dividing the dynamic range of resistances into 4 or more analog levels, each memory cell would be provided with the capability of storing 2 or more bits of binary information.

As is shown above, the memory material of the instant invention behaves differently than other previously known chalcogenide memory materials. At the present time, the physics of the switching mechanism is not completely understood. While not intending the present invention to be bojnd by any particular theory, the inventors believe that the material is in the form of a myriad of microcrystallites each having an amorphous surface zone. This surface zone is believed to be the area which controls the material's apparent bulk resistance. It is theorized that, during switching, the input electrical signals adjust the Fermi level of the amorphous surface zone by movement of a very few Ge atoms into or out of said surface zone. This movement of Ge atoms changes the ratio of holes to electrons in the surface zone thereby moving the Fermi level and changing the apparent bulk resistance of the material.

Through the use of the proprietary materials and device configurations disclosed herein, the electrically erasable, directly overwritable memory cell of the instant invention provides fast read and write speeds which approach that of SRAM devices, the non-volatility and random access reprogramming capabilities of EEPROM and a price per megabyte of storage which can begin to approach that of hard disk memory.

It will be seen from the foregoing that the electrically erasable phase change memory of the present invention provides remarkable improvements in performance over that attainable with prior art electrically erasable phase change memories which permit the widespread application of such memories beyond that possible with such prior art memories. It is to be understood that the disclosure set forth herein is presented in the form of the detailed embodiments described for the purpose of making a full and complete disclosure of the present invention, and that such details are not to be interpreted as limiting in any way the true scope of this invention as set forth and defined in the appended claims.

We claim:

1. An electrically operated, directly overwritable, multibit, single-cell memory element comprising:
    a volume of memory material defining a single cell memory element, said memory material constituting means for assuming a large dynamic range of electrical resistance values with the ability to be set directly to one of a plurality of resistance values within said dynamic range without the need to be set to a specific starting or erased resistance value, regardless of the previous resistance value of said material in response to a selected electrical input signal so as to provide said single cell with multibit storage capabilities; and
    a pair of spacedly disposed contacts for supplying said electrical input signal to set said memory material to a selected resistance value within said dynamic range.

2. The memory element of claim 1 wherein said single cell includes a monolithic body of memory material.

3. The memory element of claim 2 wherein said monolithic body of memory material is formed of chalcogenide material.

4. The memory element of claim 3 wherein said body of chalcogenide material is homogenous.

5. The memory element of claim 1 wherein said dynamic range of resistance values provides for at least 4 distinct detectable levels of electrical resistance values.

6. The memory element of claim 1 wherein said dynamic range and said multibit capabilities provides storage for at least 2 bits of binary information in a single cell memory element.

7. The memory element of claim 1 wherein said memory material is selected from the group consisting of Se, Te, Ge, Sb and mixtures or alloys thereof.

8. The memory element of claim 7 wherein said memory material include Te, Ge and Sb in the ratio $Te_a\text{-}Ge_bSb_{100-(a+b)}$ where the subscripts are in atomic percentages which total 100% of the constituent elements and $a \leq 70$ and $15 \leq b \leq 50$.

9. The memory element of claim 8 where $40 \leq a \leq 60$ and $17 \leq b \leq 44$.

10. The memory element of claim 1 wherein said volume of memory material is operatively disposed in a pore.

11. The memory element of claim 10 wherein the diameter of said pore is less than 2 microns.

12. The memory element of claim 1 wherein said selected electrical signal which sets said memory material to any resistance value within said dynamic range is at least one electrical signal pulse of a selected signal voltage and a selected signal duration.

13. The memory element of claim 12 wherein said memory material can be set to a resultant resistance within said dynamic range by a signal voltage of between about 1 Volt and about 25 Volts.

14. The memory element of claim 13 wherein said memory material can be set to a resultant resistance within said dynamic range by a signal voltage of between about 3 Volts and about 9 Volts.

15. The memory element of claim 12 wherein said memory material can be set to a resultant resistance within said dynamic range by a selected signal duration of less than about 250 nanoseconds.

16. The memory element of claim 15 wherein said memory material can be set to a resultant resistance within said dynamic range by a selected signal duration of less than about 50 nanoseconds.

17. The memory element of claim 12 wherein said selected electrical signal is a plurality of electrical signal pulses, and a feedback loop is provided for initiating additional pulses to insure that said memory element is set at the selected resistance value.

18. The memory element of claim 17 wherein the total duration of said plurality of electrical signal pulses in said feedback loop is less than about 500 nanoseconds.

19. The memory element of claim 1 wherein said volume of memory material and said contacts are formed so as to define a matrix array of thin film material.

20. The memory element of claim 19 wherein each memory element in said array is addressably isolated from other memory element in the array by thin film isolation devices.

21. The memory element of claim 20 wherein the combination of thin film memory elements and isolation devices define a three dimensional, multilevel array of discreetly addressable high density and multibit memory cells.

22. The memory element of claim 12 wherein said volume of memory material is settable at a resistance value of about $6 \times 10^3$ ohms for a signal voltage of about 3 Volts and a signal duration of about 25 nanoseconds.

23. The memory element of claim 12 wherein said volume of memory material is settable at a resistance value of about $7 \times 10^4$ ohms for a signal voltage of about 9 Volt and a signal duration of about 25 nanoseconds.

24. The memory element of claim 1 wherein the thickness of the volume memory material is from about 500 Å to 5000 Å.

25. An electrically operated memory array of directly overwritable, multibit, single-cell memory elements comprising:
    a substrate;
    a plurality of electrically activated, directly overwritable multibit single-cell memory elements spacedly disposed in rows and columns on said substrate;
    each of said memory elements having an isolation device associated therewith to electrically isolate each element from the remainder of said plurality of memory elements;

each of said memory elements comprising a volume of memory material defining a single-cell memory element;

said memory material constituting means for assuming a large dynamic range of electrical resistance values with the ability to be set directly to one of a plurality of resistance values within said dynamic range without the need to be set to a specific starting or erased resistance value, regardless of the previous resistance value of said material in response to a selected electrical input signal so as to provide said single cell with multibit storage capacities; and each of said memory elements having a pair of spacedly disposed contacts for supplying said electrical input signal to set said memory material means to a selected resistance value within said dynamic range; and address lines extending over the upper and lower portions respectively of said memory elements and making electrical contact on one side of each of said memory elements with said volume of memory material means and on the other side of each of said memory elements with said isolation device, thereby providing means for selectively and individually setting and reading said resistance values of each discrete memory element.

26. The memory array of claim 25 wherein each of said single-cell memory elements includes a monolithic body of memory material.

27. The memory array of claim 26 wherein said monolithic body of memory material is formed of chalcogenide material.

28. The memory element of claim 27 wherein said body of chalcogenide material is homogeneous.

29. The memory array of claim 25 wherein said dynamic range of resistance values provides for at least 4 distinct detectable levels of electrical resistance values.

30. The memory array of claim 26 wherein said dynamic range and said multibit capabilities provides storage for at least 2 bits of binary information in a single cell memory element.

31. The memory array of claim 25 wherein said memory material is selected from the group consisting of Se, Te, Ge, Sb and mixtures or alloys thereof.

32. The memory array of claim 31 wherein said memory material includes Te, Ge and Sb substantially in the ratio $Te_a Ge_b Sb_{100-(a+b)}$ where the subscripts are in atomic percentages which total 100% of the constituent elements and a $\leq 70$ and $15 \leq b \leq 50$.

33. The memory array of claim 32 where $40 \leq a \leq 60$ and $17 \leq b \leq 44$.

34. The memory array of claim 25 wherein said volume of memory material of each cell is operatively disposed in a pore.

35. The memory array of claim 34 wherein the diameter of said pore is less than 2 microns.

36. The memory array of claim 25 wherein said selected electrical signal which sets said memory material to any resistance value within said dynamic range is at least one electrical signal pulse of a selected signal voltage and a selected signal duration.

37. The memory array of claim 36 wherein said memory material can be set to a resultant resistance within said dynamic range by a signal voltage of between about 1 Volt and about 25 Volts.

38. The memory array of claim 37 wherein said memory material can be set to a resultant resistance within said dynamic range by a signal voltage of between about 3 Volts and about 10 Volts.

39. The memory array of claim 36 wherein said memory material can be set to a resultant resistance within said dynamic range by a selected signal duration of less than about 250 manoseconds.

40. The memory array of claim 39 wherein said memory material can be set to a resultant resistance within said dynamic range by a selected signal duration of less than about 50 manoseconds.

41. The memory array of claim 36 wherein said selected electrical signal is a plurality of electrical signal pulses and a feedback loop is provided for initiating additional pulses to insure that said memory element of each cell is set at the selected resistance value.

42. The memory array of claim 41 wherein the total duration of said plurality of electrical signal pulses in said feedback loop is less than about 500 manoseconds.

43. The memory array of claim 25 wherein said volume of memory material and said contact are formed as to define a matrix array of thin film materials.

44. The memory array of claim 36 wherein said volume of memory material of each cell is settable at a resistance value of about $6 \times 10^3$ ohms for a signal voltage of about 3 Volts and a signal duration of about 25 nanoseconds.

45. The memory array of claim 36 wherein said volume of memory material of each cell is settable at a resistance value of about $7 \times 10^4$ ohms for a signal voltage of about 9 Volt and a signal duration of about 25 nanoseconds.

46. The memory array of claim 25 wherein the thickness of the volume of memory material of each cell is from about 500 Å to about 5000 Å.

47. The memory array of claim 25 wherein said isolation devices are thin film diodes.

48. The memory array of claim 25 wherein said isolation devices are transistors.

49. The memory array of claim 47 wherein said thin film diodes include a semiconductor junction.

50. The memory array of claim 49 wherein said semiconductor junction is formed at a surface of said diode which extends substantially parallel to the surface of said substrate.

51. The memory array of claim 49 wherein said semiconductor junction is defined within a Schottky barrier diode.

52. The memory array of claim 49 wherein said semiconductor junction is defined within a p-n junction diode.

53. The memory array of claim 49 wherein said semiconductor junction is defined within a p-i-n junction diode.

54. The memory array of claim 47 wherein said thin film diodes are formed of non-single crystal semiconductor material.

55. The memory array of claim 54 wherein said non-single crystal semiconductor material is selected from the group consisting of Si, Ge, chalcogenide elements, and combinations thereof.

56. The memory array of claim 50 wherein said opposed sides of each of said memory elements which electrically contact said address lines are positioned in vertical relationship to each other.

57. The memory array of claim 56 wherein said opposed sides of each of said memory elements which electrically contact said address lines include contact surfaces which extend substantially parallel to each other and to the surface of said substrate.

58. The memory array of claim 25 further comprising a layer of encapsulating material extending over and sealing said memory elements against environmental influences.

59. The memory array of claim 25 wherein all memory elements and isolation devices are formed of thin film materials, and the array includes at least one additional plane which is formed of a plurality of rows and columns of said multibit single cell memory elements.

60. An electrically operated, directly overwritable, multibit, single-cell memory element based on phenomenologically novel electrical switching behavior comprising:

a volume of memory material defining a single cell memory element, said memory material constituting means for assuming a large dynamic range of electrical resistance values with the ability to be set directly to one of a plurality of resistance values within said dynamic range without the need to be set to a specific starting or erased resistance value, regardless of the previous resistance value of said material in response to a selected electrical input signal so as to provide said single cell with multibit storage capabilities with the ability to be set directly to low resistance values within said dynamic range by electrical input signals of low energy and to be set directly to higher resistance values within said dynamic range by electrical input signals of higher energy; and a pair of spacedly disposed contacts for supplying said electrical input signal to set said memory material to a selected resistance value within said dynamic range, 61. The memory element of claim 60 wherein said single cell includes a monolithic body of memory material.

62. The memory element of claim 61 wherein said monolithic body of memory material formed of chalcogenide material.

63. The memory element of claim 62 wherein said body of chalcogenide material is homogenous.

64. The memory element of claim 60 wherein said dynamic range of resistance values provides for at least 4 distinct detectable levels of electrical resistance values.

65. The memory element of claim 60 wherein said dynamic range and said multibit capabilities provides storage for at least 2 bits of binary information in a single cell memory element.

66. The memory element of claim 60 wherein said selected electrical signal which sets said memory material to any resistance value within said dynamic range is at least one electrical signal pulse of a selected signal voltage and a selected signal duration.

67. The memory element of claim 66 wherein said memory material can be set to a resultant resistance within said dynamic range by a selected signal duration of less that about 250 nanoseconds.

68. The memory element of claim 67 wherein said memory material can be set to a resultant resistance within said dynamic range by a selected signal duration of less than about 50 nanoseconds.

69. The memory element of claim 66 wherein said selected electrical signal is a plurality of electrical signal pulses, and a feedback loop is provided for initiating additional pulses to insure that said memory element is set at the selected resistance value.

70. The memory element of claim 69 wherein the total duration of said plurality of electrical signal pulses in said feedback loop is less than about 500 nanoseconds.

* * * * *